(12) United States Patent
Greer

(10) Patent No.: US 6,636,731 B1
(45) Date of Patent: Oct. 21, 2003

(54) DEMODULATION METHOD PRESERVING A HIGH SPECTRAL PURITY

(75) Inventor: Nigel Greer, Hottot les Bagues (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 312 days.

(21) Appl. No.: 09/658,933

(22) Filed: Sep. 11, 2000

(30) Foreign Application Priority Data

Sep. 14, 1999 (FR) .............................. 99 11481

(51) Int. Cl.$^7$ .................................. H04B 1/10
(52) U.S. Cl. ........................ 455/307; 455/309
(58) Field of Search ................. 455/214, 286, 455/302, 303, 307, 308, 336, 337, 133, 134, 135, 309, 296; 375/316, 342

(56) References Cited

U.S. PATENT DOCUMENTS

| 4,776,039 A | * | 10/1988 | Akaiwa ..................... 455/205 |
| 4,837,853 A | * | 6/1989 | Heck ......................... 455/208 |
| 4,989,169 A | * | 1/1991 | McCaslin et al. ........... 708/312 |
| 5,034,997 A | * | 7/1991 | Iwasaki ..................... 359/154 |
| 5,315,262 A | * | 5/1994 | Schulz ....................... 329/302 |
| 5,345,601 A | * | 9/1994 | Takagi et al. ................. 455/59 |
| 5,757,864 A | * | 5/1998 | Petranovich et al. ........ 375/344 |
| 5,878,087 A | * | 3/1999 | Ichihara ..................... 375/316 |
| 6,208,849 B1 | * | 3/2001 | Cho et al. ................... 455/296 |

\* cited by examiner

*Primary Examiner*—Nay Maung
*Assistant Examiner*—Tan Trinh
(74) *Attorney, Agent, or Firm*—Jack D. Slobod

(57) ABSTRACT

The invention relates to a method of demodulating a signal (I, Q) that has a main component and harmonics. According to the invetion, this method includes the following of a selection of one of the harmonics, and a demodulation of the selected harmonic. The invention enables the elimination of a parasitic component introduced by the demodulation into the demodulated signal SD without altering the data carried by the signal SD.

6 Claims, 1 Drawing Sheet

DEMODULATION METHOD PRESERVING A HIGH SPECTRAL PURITY

FIELD OF THE INVENTION

The invention relates to a method of demodulating a signal having a main component and harmonics.

Such methods are currently used within appliances for receiving electromagnetic radio signals, which appliances comprise in general: (a) an antenna system enabling the reception of an electromagnetic signal and the transformation thereof into an electronic signal, called radio signal, having a radio frequency, (b) a frequency conversion device designed to deliver a signal, called intermediate signal, which has an intermediate frequency and is representative of the radio signal, and (c) a device for demodulating the intermediate signal.

BACKGROUND OF THE INVENTION

In known receiver devices, the intermediate signal has a main component and harmonics and is submitted to a bandpass filtering before being demodulated, which filtering has the effect of suppressing the harmonics. The main component is thus selected because it has a higher amplitude and is on that account considered more significant than the harmonics, so that it is this main component which is the object of a demodulation.

One of the major trends in the electronics industry is the effort to reduce the size of manufactured appliances, with a triple aim of reducing the production cost, reducing the power consumption, and increasing the user comfort by decreasing the weight and bulkiness of the appliances thus miniaturized.

The frequency converter and the demodulation device are accordingly more and more realized in the form of integrated circuits, indeed joined together in a single integrated circuit. The realization of the frequency converter in an integrated form requires that the value of the intermediate frequency should be comparatively low. Leakage effects take place between the input and the output of the demodulator, which lead to the appearance of a parasitic component in the output signal of the demodulator with the frequency of its input signal. If the variation ranges of the frequencies of the input and output signals of the demodulator overlap, it is impossible to filter out the parasitic component without affecting the demodulated signal. This parasitic component substantially degrades the performance of the appliance, in particular if the received radio signal is of low power.

In a radiotelephone complying with the DECT standard, for example, including an integrated frequency converter, the central intermediate frequency is chosen to be equal to 864 kHz, which implies that the instantaneous frequency of the input signal of the demodulator varies between 400 and 1300 kHz, while the variation range of the frequency of the demodulated signal is from 0 to 700 kHz. Now since the leakage effects are mainly due to imperfect attunements between various elements which form the demodulator, and are strongly linked to imperfections in the manufacturing process used for producing the demodulator, the amplitude of these leakage effects may vary considerably from one demodulator to the next, which leads to random drops in the efficiency of the manufacture of the known demodulators.

SUMMARY OF THE INVENTION

The invention has for its object to remedy these disadvantages by proposing a demodulation method that ensures that the variation ranges of the frequencies of the input and output signals of the demodulator do not overlap.

According to the invention, therefore, a method of demodulating a signal having a main component and harmonics basically comprises: (a) a selection of one of the harmonics, and (b) a demodulation of the selected harmonic.

According to this method, the parasitic component introduced by the demodulator into the demodulated signal will have the frequency of the selected harmonic as its central frequency. To take again the example of the DECT type radiotelephone referred to above, the central frequency of the third harmonic, which is the harmonic closest to the main component of the intermediate signal, is of the order of 2.6 MHz, with its instantaneous frequency varying between 1.3 and 3.9 MHz.

The method according to the invention thus enables the elimination of the parasitic component, for example by a low-pass filtering, without affecting the data transmitted by the demodulated signal.

Generally, the invention may be implemented in all types of applications in which a demodulator is likely to generate leakage effects. The invention thus also relates to a demodulation device for a signal having a main component and harmonics, the device comprising: (a) a bandpass filter designed to receive said signal and to deliver a filtered signal, and (b) a demodulator designed to receive the filtered signal and to deliver a demodulated signal, which device is characterized in that the bandpass filter has a characteristic which is adjusted around a central frequency of one of the harmonics.

In one of its most advantageous embodiments, the invention also relates to a receiver for electromagnetic signals, the receiver comprising: (a) an antenna system enabling the reception of an electromagnetic signal and the transformation thereof into an electronic signal, called radio signal, having a radio frequency, (b) a frequency conversion device designed to deliver a signal, called intermediate signal, which has an intermediate frequency and is representative of the radio signal, and (c) a device for demodulating the intermediate signal, characterized in that the demodulation device includes the bandpass filter and the demodulator of the previous paragraph.

BRIEF DESCRIPTION OF THE DRAWINGS

The invention will be better understood from the following description which is given by way of example, to which the invention is not limited, with reference to the annexed drawings, in which.

DETAILED DESCRIPTION OF THE PRESENTLY PREFERRED EMBODIMENTS

Figure 1:
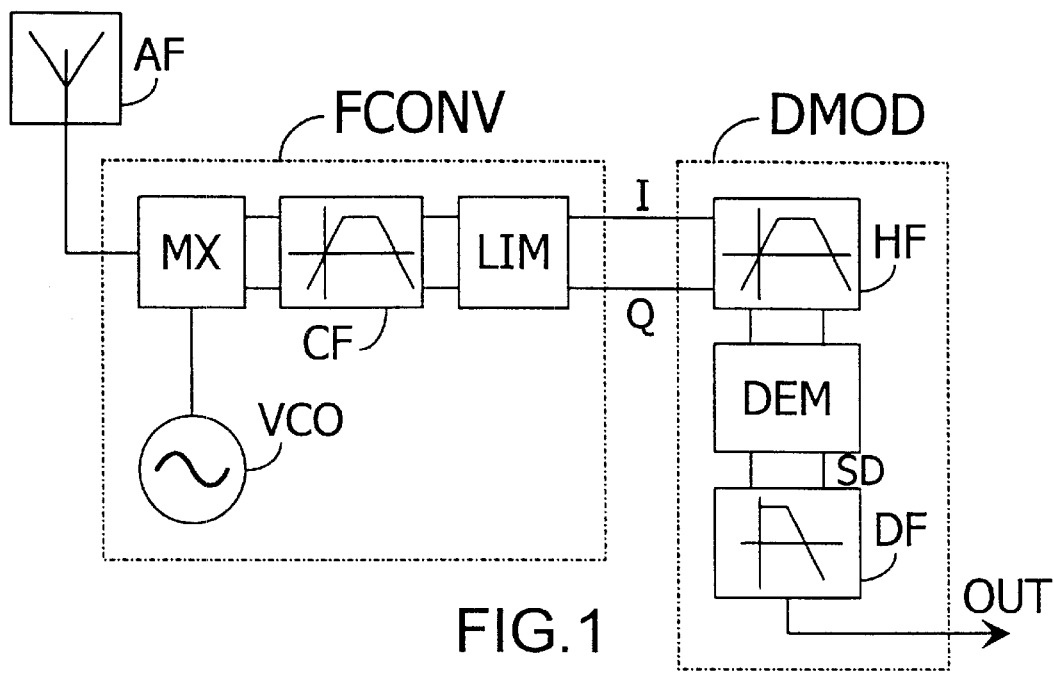
FIG. 1 is a partial block diagram representing a receiver for electromagnetic signals in which the invention is implemented.

FIG. 1 diagrammatically shows a receiver for electromagnetic radio signals, comprising: an antenna system AF, a frequency conversion device FCONV and a demodulation device DMOD. Antenna system AF enables the reception of an electromagnetic signal and its transformation into an electronic signal, called radio signal here, having a radio frequency. Frequency conversion device FCONV is designed to deliver a signal (I, Q), called intermediate signal here, which has an intermediate frequency and is representative of the radio signal. Demodulation device DMOD for demodulating the intermediate signal (I, Q).

The conversion device FCONV includes an oscillator VCO and a mixer MX designed to receive the radio signal and a signal supplied by the oscillator VCO. The mixer MX supplies a signal that is filtered by a selection filter CF which carries out a selection of one particular component of the output signal of the mixer MX. The selection filter CF generally is a low-pass filter of the polyphase type which has a characteristic adjusted around the central frequency of the component to be selected. This central frequency then constitutes the intermediate frequency. If the selection filter CF is realized in integrated form, it will be composed of elements which have parasitic resistances and capacitances, which lead to adverse effects on the behavior of the filter, which effects are the more significant as the frequency around which the filter is calibrated is higher. These adverse effects are particularly noticeable when the signal to be filtered has a high noise level, which is the case here because it comes from an antenna system AF via the mixer MX. Moreover, the power consumption of the selection filter CF will be higher in proportion as the intermediate frequency is higher. A comparatively low intermediate frequency is usually chosen for that reason. In a DECT type receiver, for example, the filter characteristic chosen is centered on a frequency equal to 864 kHz, i.e., half a bandwidth of a channel that is fixed at 1.728 MHz. The selection filter CF supplies an output signal that has a sinusoidal shape to a limiter LIM which performs a strong amplification of the output signal, and thus delivers an intermediate signal (I, Q) which has a square-wave shape. The transformation of a sinusoidal signal into a square-wave signal is achieved by making amplifiers operate in the saturated state, which has the effect of introducing harmonics into the intermediate signal (I, Q), in addition to the main component selected by the selection filter CF.

The demodulation device DMOD includes a bandpass filter HF, which is designed to receive the intermediate signal (I, Q) and to deliver a filtered signal, and a demodulator DEM designed to receive the filtered signal and to deliver a demodulated signal SD of which a main component contains data carried by said signal. The demodulator DEM gives rise to leakage effects which introduce a parasitic component having a central frequency, which is equal to the frequency on which the characteristic of the bandpass filter HF is centered, into the demodulated signal SD. This parasitic component may substantially degrade the performance of the appliance, in particular if the received radio signal is of low power.

The demodulation device DMOD also includes a data filter DF, which is a low-pass filter. Indeed, the invention enables To separate the main component of the demodulated signal SD from the parasitic component introduced into the signal by the leakage effects. The demodulation device DMO thus supplies an output signal OUT which is feed from the parasitic component without the data transmitted by this output signal having been affected.

Figure 2:
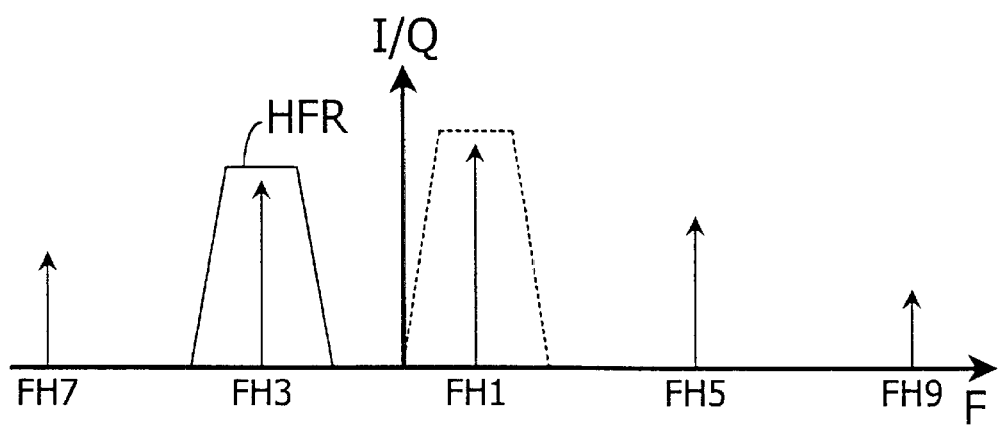
FIG. 2 is a spectral diagram showing the frequency composition of a signal present in such a receiver.

FIG. 2 is a spectral diagram showing the frequency composition of the intermediate signal (I, Q). This signal has a main component whose central frequency is FH1 and harmonics whose central frequencies are FH3, FH5, FH7, FH9, etc. In known demodulators, the bandpass filter HF has a characteristic, shown in broken lines here, which is centered on the central frequency FH1 of the main component of the intermediate signal (I, Q). In the demodulator according to the present invention the characteristic HFR of the bandpass filter HF is centered on the central frequency of one of the harmonics. In the example described here, this is the central frequency FH3 of the third harmonic. This choice is linked with the fact that the third harmonic is the one whose amplitude is highest and whose frequency is lowest. The central frequency H1 of the main component in the DECT receiver referred to in the preceding example is equal to 864 kHz, whereas the central frequency H3 of the third harmonic is of the order of 2.6 MHz.

Figure 3:
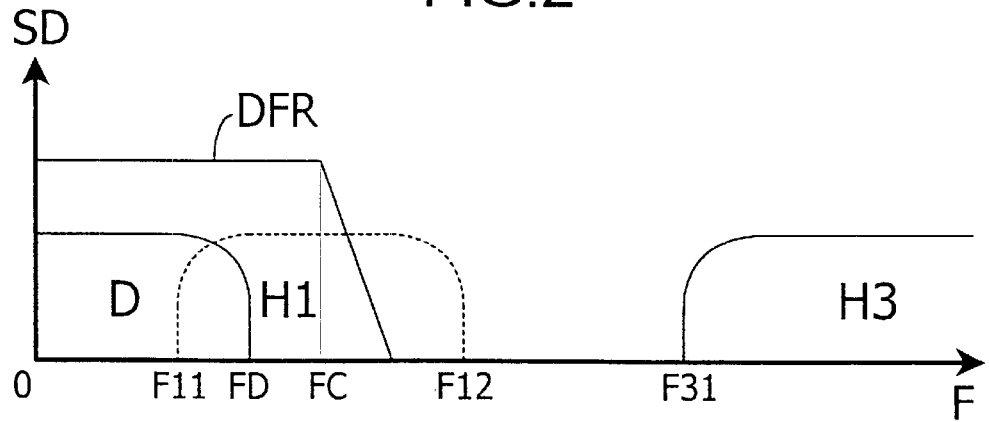
FIG. 3 is a spectral diagram illustrating the frequency composition of another signal present in such a receiver.

FIG. 3 is a spectral diagram showing the possible variation ranges of the instantaneous frequencies of various components featured by the demodulated signal SD. The region D represents the variation range of the instantaneous frequency of the main component of the demodulated signal, which main component caries the payload data. This region D extends from the frequency zero to a frequency FD.

A region H1, shown in broken lines, represents the variation range of the instantaneous frequency of the parasitic component introduced by the demodulator DEM into the demodulated signal SD in known demodulation devices, in which the characteristic of the bandpass filter is set around the central frequency H1 of the main component of the intermediate signal. This region H1 extends from a frequency F11 to a frequency F12. In the case of the DECT receiver referred to in the example above, the frequency FD is equal to 700 kHz, while the frequencies F11 and F12 are of the order of 400 and 1300 kHz, respectively. Given such values, the variation ranges of the instantaneous values of the input and output signals of the demodulator overlap, and it is impossible to filter out the parasitic component without interfering with the information which the demodulated signal is to carry, for example by a low-pass filter whose characteristic DFR is shown in FIG. 3. It is clearly apparent that it is not possible to find a cut-off frequency FC that is sufficiently low for eliminating all traces of the parasitic component without risking to alter the contents of the region D.

A region H3 represents the variation range of the instantaneous frequency of the parasitic component introduced by the demodulator DEM into the demodulated signal SD in a demodulation device according to the invention, in which the characteristic of the bandpass filter is set around the central frequency FH3 of the third harmonic of the intermediate signal. This region H3 extends from a frequency F31 to a frequency F32, not shown in FIG. 3. With a DECT receiver as described in the preceding example, the frequencies F31 and F32 are of the order of 1.3 and 3.9 MHz, respectively, Given such values, the variation ranges of the instantaneous frequencies of the input and output signals of the demodulator do not overlap, and it is possible to filter out the parasitic component without altering the information which The demodulated signal is to carry, for example by a low-pass filter whose characteristic DFR is shown in FIG. 3. It is clearly apparent that it is now possible to find a cut-off frequency FC which is sufficiently low for eliminating all traces of the parasitic component without risking to of alter the contents of the region D. It is possible, for example, to choose FD to be equal to 800 kHz.

What is claimed is:

1. A method of operating a receiver, said method comprising:

receiving and transforming an electromagnetic signal into a radio frequency signal;

converting the radio frequency signal into an intermediate frequency signal having a square-wave shape, the intermediate frequency signal including a main component and at least one harmonic;

filtering the intermediate frequency signal through a bandpass filter having a center frequency corresponding to a first harmonic of the at least one harmonic; and demodulating the filtered intermediate frequency signal to yield a demodulated signal.

2. The method of claim 1, further comprising:

filtering the demodulated signal through a lowpass filter having a cutoff frequency for eliminating all traces of any parasitic component of the demodulated signal.

3. A demodulation device, comprising:

a bandpass filter for filtering an intermediate frequency signal having a square-wave shape, the intermediate frequency signal including a main component and at least one harmonic wherein said bandpass filter has a center frequency corresponding to a first harmonic of the at least one harmonic, and a demodulator for demodulating the filtered intermediate frequency to yield a demodulated signal.

4. The demodulation device of claim 3, further comprising:

a lowpass filter for filtering the demodulated signal, said lowpass filter having a cutoff frequency for eliminating all traces of any parasitic component of the demodulated signal.

5. A receiver, comprising:

an antenna system for receiving and transforming an electromagnetic signal into a radio frequency signal;

a frequency conversion device for converting the radio frequency signal into an intermediate frequency signal having a square-wave shape, the intermediate frequency signal including a main component and at least one harmonic; and a demodulation device including a bandpass filter for filtering the intermediate frequency signal, said bandpass filter having a center frequency corresponding to a first harmonic of the at least one harmonic, and a demodulator for demodulating the filtered intermediate frequency signal to yield a demodulated signal.

6. The receiver of claim 5, wherein said demodulation device further includes:

a lowpass filter for filtering the demodulated signal, said lowpass filter having a cutoff frequency for eliminating all traces of any parasitic component of the demodulated signal.

* * * * *